(12) United States Patent
Johansson

(10) Patent No.: US 7,871,881 B2
(45) Date of Patent: Jan. 18, 2011

(54) METHOD FOR FABRICATION OF A CAPACITOR, AND A MONOLITHICALLY INTEGRATED CIRCUIT COMPRISING SUCH A CAPACITOR

(75) Inventor: Ted Johansson, Djursholm (SE)

(73) Assignee: Infineon Technologies AG, Munich (DE)

( * ) Notice: Subject to any disclaimer, the term of this patent is extended or adjusted under 35 U.S.C. 154(b) by 143 days.

(21) Appl. No.: 12/413,646

(22) Filed: Mar. 30, 2009

(65) Prior Publication Data

US 2009/0181512 A1  Jul. 16, 2009

Related U.S. Application Data

(62) Division of application No. 11/469,651, filed on Sep. 1, 2006, now Pat. No. 7,534,685.

(30) Foreign Application Priority Data

Mar. 2, 2004  (SE) .................................. 0400504

(51) Int. Cl.
*H01L 21/00* (2006.01)
(52) U.S. Cl. ....................... 438/234; 438/247; 438/269; 438/311; 438/479; 257/E21.561; 257/E21.562; 257/E21.564; 257/E21.703; 257/E27.112

(58) Field of Classification Search ......... 438/234–269, 438/311, 479; 257/E21.561–E21.564, 703, 257/27.112
See application file for complete search history.

(56) References Cited

U.S. PATENT DOCUMENTS

| 7,029,994 | B2 * | 4/2006 | Ge et al. ..................... 438/479 |
| 7,618,865 | B2 * | 11/2009 | Johansson et al. ........... 438/269 |
| 2007/0048928 | A1 * | 3/2007 | Johansson et al. ........... 438/234 |

* cited by examiner

*Primary Examiner*—Michael S Lebentritt
(74) *Attorney, Agent, or Firm*—Coats & Bennett, P.L.L.C.

(57) ABSTRACT

A method for fabrication of a monolithically integrated SOI substrate capacitor has the steps of: forming an insulating trench, which reaches down to the insulator and surrounds a region of the monocrystalline silicon of a SOI structure, doping the monocrystalline silicon region, forming an insulating, which can be nitride, layer region on a portion of the monocrystalline silicon region, forming a doped silicon layer region on the insulating layer region, and forming an insulating outside sidewall spacer on the monocrystalline silicon region, where the outside sidewall spacer surrounds the doped silicon layer region to provide an isolation between the doped silicon layer region and exposed portions of the monocrystalline silicon region. The monocrystalline silicon region, the insulating layer region, and the doped silicon layer region constitute a lower electrode, a dielectric, and an upper electrode of the capacitor.

13 Claims, 3 Drawing Sheets

METHOD FOR FABRICATION OF A CAPACITOR, AND A MONOLITHICALLY INTEGRATED CIRCUIT COMPRISING SUCH A CAPACITOR

CROSS-REFERENCE TO RELATED APPLICATIONS

This application claims priority to co-pending U.S. patent application Ser. No. 11/469,651 filed Sep. 1, 2006, which is a continuation of International Application No. PCT/SE2005/000251 filed Feb. 23, 2005, which designates the United States, and claims priority to Sweden Application Number SE0400504-7 filed Mar. 2, 2004, the content of which is expressly incorporated herein by reference in its entirety.

TECHNICAL FIELD

The present invention generally relates to the field of integrated circuit technology, and more specifically the invention relates to a method for fabrication of an SOI (Silicon-On-Insulator) substrate capacitor, and to a monolithically integrated circuit comprising such an SOI substrate capacitor.

BACKGROUND

SOI technology, especially using thin silicon top layers, which can be partially depleted (PD) or fully depleted (FD) already at very low bias voltages, are believed to become a key contributor to the continuous increase of circuit performance as predicted by Moore's law. Various press announcements show that the main IC manufacturers today are evaluating SOI for process generations capable of producing features of sizes less than 100 nm. Some of these manufacturers focus their production on PD SOI using industrially available SOI wafers, and all of them are evaluating the potential of FD SOI for low-power digital, mixed and RF applications. SOI technology today is mainly applied in the field of high-speed processor technology. Processors are now produced based on 90 nm CMOS PD SOI with speeds of about 1 to 1.6 GHz corresponding to a speed gain of about 20-25%.

It is well known to modify CMOS devices for PD or FD SOI. However, to adopt an RF BiCMOS process for PD or FD SOI is a much more complex task. There is no simple way of building bipolar devices on the thin SOI material with similar performance as on bulk material. However, U.S. Pat. No. 5,087,580 to Eklund, and J. Cai et al., Vertical SiGe-Base Bipolar Transistors on CMOS-Compatible SOI Substrate, p. 215 in Proceedings of the 2003 Bipolar/BiCMOS Circuits and Technology Meeting describe bipolar vertical-lateral transistors adopted for SOI.

As any RF process, i.e. CMOS, bipolar or BiCMOS process, includes a number of high-performance passive devices such as capacitors, resistors, varactors, inductors, etc., these devices have also to be redesigned for the new substrate material.

In previous processes on bulk silicon, a capacitor having high capacitance per area and high breakdown voltage is formed using a thin layer of silicon nitride deposited on top of highly doped silicon. A highly doped polycrystalline silicon layer region on top of the nitride serves as the top electrode. The bottom electrode consists of a subcollector layer and a collector plug arrangement to the upper side of the substrate. The thickness of the nitride layer is chosen so that the capacitor will obtain high capacitance values per area unit such as e.g. 2-4 $fF/\mu m^2$.

The fabrication of such capacitors on bulk silicon is disclosed in U.S. Pat. No. 6,610,578 (inventors: H. Norström, S. Nygren and O. Tylstedt) and WO 02/091463 (inventors: T. Johansson, H. Norström and P. Algotsson).

A similar method to realize a capacitor is disclosed by H. Klose et al, B6HF: A 0.8 micron 25 GHz/25 ps bipolar technology for "Mobile radio" and "Ultra fast data link" IC-products, p. 25 in Proceedings of the 1993 Bipolar/BiCMOS Circuits and Technology Meeting. The capacitor is however described as ONO-type (ONO, oxide-nitride-oxide) with a capacitance value of 2 $fF/\mu m^2$, which means that the fabrication method is different.

In other bulk processes for BiCMOS, substrate capacitors may consist of a MOS-similar structure, where the gate oxide serves as dielectric.

When using thin SOI layers, i.e. layers having a thickness of less than 200 nm, the isolation regions extend all the way down to the buried oxide layer, and thus the capacitor structures disclosed above cannot be fabricated.

SUMMARY

A silicon nitride capacitor having high capacitance per area and high breakdown voltage can be provided by a method for thin SOI layers, for which MOS devices will be partly or fully depleted. A method can be provided, which when implemented in a conventional bipolar or BiCMOS SOI process does not add any further process steps. Furthermore, a method can be provided, which when implemented in a conventional CMOS SOI process only needs a minimum of further process steps added to the process. Thus, a monolithically integrated circuit may comprise an SOI substrate capacitor.

According to one aspect, there can be provided a method for fabrication of a monolithically integrated SOI substrate capacitor, comprising the steps of: forming an insulating trench in a monocrystalline silicon top layer of a SOI structure, which trench reaches down to the buried insulator and surrounds a region of the monocrystalline silicon top layer of the SOI structure; doping the monocrystalline silicon top layer region; forming an insulating, which can be nitride, layer region on a portion of the monocrystalline silicon top layer region; forming a doped silicon layer region on the insulating layer region; and forming an insulating outside sidewall spacer on the monocrystalline silicon region, where the outside spacer surrounds the doped silicon layer region to provide an isolation between the doped silicon layer region and exposed portions of the monocrystalline silicon top layer region. The monocrystalline silicon top layer region, the insulating layer region, and the doped silicon layer region constitute a lower electrode, a dielectric, and an upper electrode of the capacitor.

Further characteristics and advantages will be evident from the detailed description of embodiments given hereinafter and the accompanying FIGS. 1-8, which are given by way of illustration only, and are thus not limitative of the present invention.

DETAILED DESCRIPTION

The monocrystalline silicon top layer region can be formed to a thickness of less than about 200 nm to allow for the fabrication of partly or fully depleted MOS devices therein.

According to another aspect, there can be provided a monolithically integrated circuit comprising an SOI-substrate-based plate capacitor. The lower electrode of the capacitor is comprised of a doped monocrystalline SOI layer region surrounded by an insulating trench, which reaches down to a buried oxide layer of the SOI structure. The dielectric of the capacitor is comprised of a layer region of an insulating material, which can be nitride, on top of a portion of the monocrystalline SOI layer region. The upper electrode is comprised of a doped polycrystalline silicon layer region on top of the layer region of insulating material. An outside sidewall spacer structure of an insulating material, which surrounds the doped polycrystalline silicon layer region, provides isolation between the doped polycrystalline silicon layer region and exposed portions of the monocrystalline SOI layer region.

The doped polycrystalline silicon layer region and the exposed portions of the monocrystalline SOI layer region can be silicided, and metallic contacts to them are provided.

Thus, a monolithically integrated SOI substrate capacitor can be provided, which has high capacitance per area unit, and can thus be made very compact. The use of doped monocrystalline silicon as lower electrode provides for a capacitor having low series resistance. The use of silicon nitride as the sole material for the capacitor dielectric has several advantages such as higher breakdown voltage and higher capacitance per unit area.

A first embodiment of a method in the fabrication of a monolithically integrated circuit including an SOI substrate capacitor is described below with reference to FIGS. 1-6. The method is implemented in a CMOS, bipolar or BiCMOS process.

Figure 1:
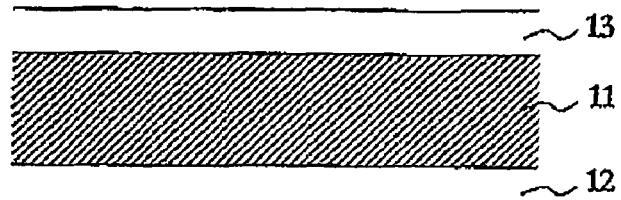
FIGS. 1-8 are highly enlarged cross-sectional views of embodiments of a portion of a semiconductor structure during processing.

A semiconductor structure is shown in FIG. 1 in cross section. A buried silicon oxide layer 11 is arranged between a silicon bulk substrate 12 and a monocrystalline silicon layer 13 to form a common SOI structure. The monocrystalline silicon layer 13 is a thin layer having advantageously a thickness of less than about 200 nm in order to be capable of fabricating fully depleted or partially depleted MOS devices provided that the fabrication process is a CMOS or BiCMOS process.

Figure 2:
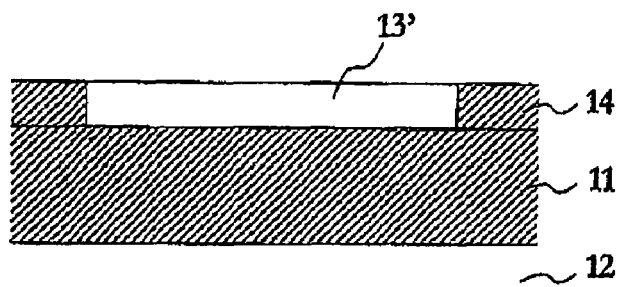

In the monocrystalline silicon layer 13, a trench 14 is formed to surround a region 13' of the monocrystalline layer 13 of silicon. The trench 14, which can be formed by masking and etching, is filled with insulating material to form a shallow trench isolation (STI) region. Due to the small thickness of the monocrystalline silicon layer 13, the trench 14 reaches down to the buried silicon oxide layer 11. The resulting structure is illustrated in FIG. 2.

A thin oxide layer 15 is formed on the monocrystalline layer region 13' and an implantation mask 16 is applied on the structure. The thin oxide layer 15 may be a deposited low-quality oxide for the sole purpose of the ion implantation, or may be a grown high-quality oxide for use as e.g. gate oxides for MOS transistors in a CMOS or BiCMOS process.

Figure 3:
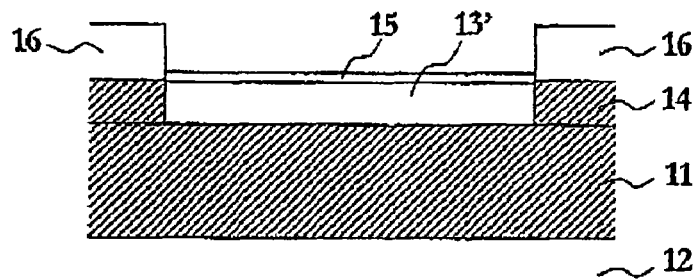

The monocrystalline silicon layer region 13', surrounded by the trench 14, is next doped to $n^{++}$ or $p^{++}$ to form a lower electrode of the monolithically integrated SOI substrate capacitor. If the substrate capacitor is fabricated in a bipolar or BiCMOS process, the silicon monocrystalline layer region 13' can be doped simultaneously with $n^+$ low-resistance collector contacts or plugs for bipolar transistors. The resulting structure is illustrated in FIG. 3.

Figure 4:
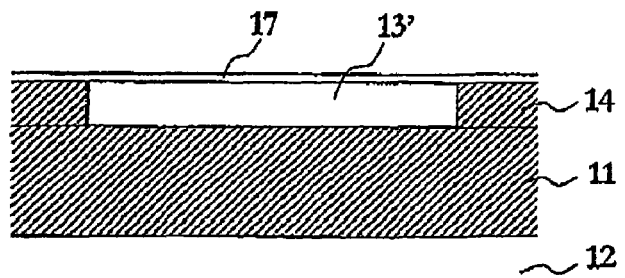

After ion implantation, the mask 16 and the thin oxide layer 15 are removed, and a thin layer 17 of an insulating material, which can be silicon nitride, is formed on top of the structure. The resulting structure is illustrated in FIG. 4.

If the fabrication process is a bipolar or BiCMOS process, the thin insulating layer 17 can be used for isolation between extrinsic base connections and collector regions of bipolar transistors to lower the parasitic capacitance of the base-collector junctions, and if the fabrication process is a CMOS or BiCMOS process, the thin insulating layer 17 can be used for encapsulation of the gates of MOS transistors during subsequent processing e.g. in order to protect them from unwanted oxidation.

On top of the thin layer 17, a layer of polycrystalline silicon is formed. This silicon layer is either doped to $n^{++}$ or $p^{++}$ simultaneously with its deposition, or is doped to $n^{++}$ or $p^{++}$ subsequent to deposition by means of ion implantation.

Figure 5:
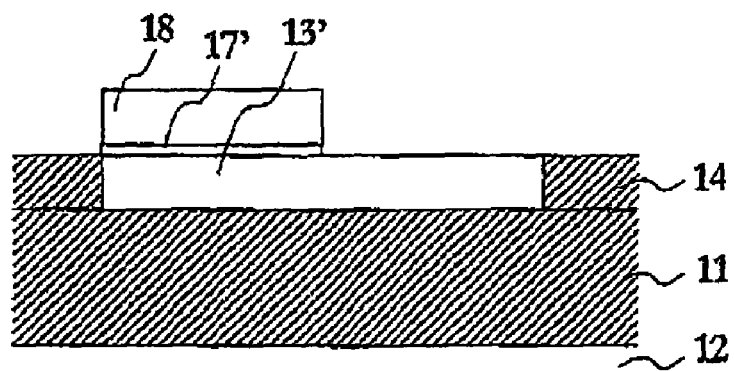

The polycrystalline silicon layer and the thin insulating layer 17 are next patterned and etched to form layer regions 18, 17' of doped silicon and insulating material, respectively, on top of a portion of the monocrystalline silicon layer region 13' as being illustrated in FIG. 5. The etching may be performed in a two-step etch process. The doped silicon layer region 18 constitutes an upper electrode of the monolithically integrated SOI substrate capacitor, whereas the insulating layer region 17' constitutes a dielectric thereof. The insulating layer region 17' may be of a material having a high dielectric number, such as silicon nitride, since a high capacitance per area unit is obtained.

If the fabrication process is a bipolar or BiCMOS process base layer regions, i.e. extrinsic bases, for bipolar transistors can be formed in the polycrystalline silicon layer at least partly simultaneously with the formation of the silicon layer region 18.

The processing continues next with sidewall spacer formation: an outside spacer 61 of an insulating material is formed on top of the monocrystalline silicon layer region 13', and, depending on the layout, on top of the trench 14, where the outside spacer 61 surrounds the polycrystalline silicon layer region 18 to provide electric isolation between the polycrystalline silicon layer region 18 and exposed portions of the monocrystalline silicon layer region 13'. The spacer 61 is advantageously formed by means of conformal deposition of oxide or nitride followed by anisotropic etching.

Figure 6:
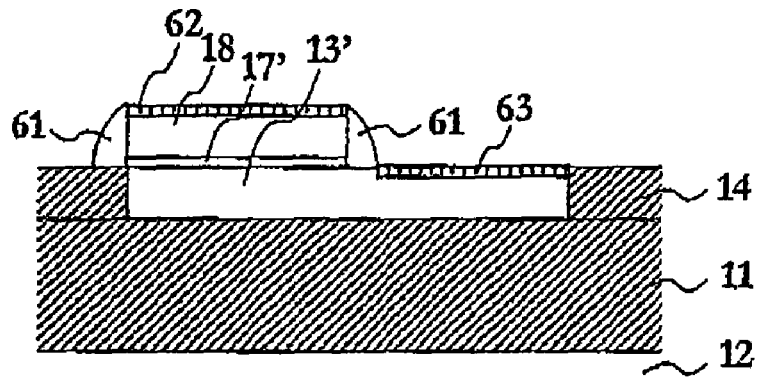

Then, exposed silicon surfaces are silicided, for example, by using a so-called self-aligned silicide (SALICIDE) method. A thin metal layer is deposited on the structure, and is made to react with exposed silicon at an elevated temperature to form a silicide. Thereafter, metal that has not reacted with silicon, i.e. the metal at those portions, which had no exposed silicon surface prior to the metal deposition, is removed by wet chemical methods. As a result, metal silicide layer regions 62, 63 are formed on top of the upper surface of the polycrystalline silicon layer region 18, and on top of the exposed portions of the monocrystalline silicon layer region 13' to provide low-resistance connections. The resulting structure is illustrated in FIG. 6.

The processing continues with metallization in a customary manner, i.e. by forming a passivation layer, in which contact holes are etched and subsequently filled with metallic material, to achieve low-resistance connection paths from the capacitor electrodes 18, 13' to the metallization layers formed on top of the passivation layer.

The monolithically integrated SOI substrate capacitor thus formed can be made compact as it has high capacitance per area unit. The use of doped monocrystalline silicon as lower electrode provides for low series resistance.

Figure 7:
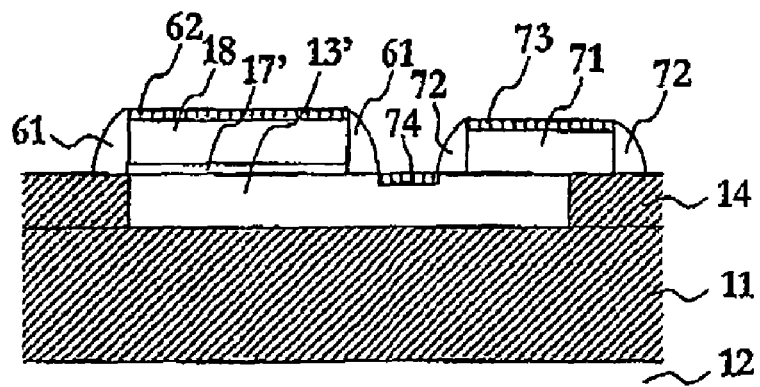

A further embodiment of the fabrication method is illustrated in FIG. 7. Here, a further doped polycrystalline silicon layer region 71 is formed prior to silicidation by means of depositing a polycrystalline silicon layer followed by patterning and etching the same. Doping may be performed simultaneously with the deposition of the layer or afterward by means of ion implantation. The further doped polycrystalline silicon layer region 71 is located laterally separated from the polycrystalline silicon layer region 18, which constitutes the upper electrode of the capacitor, and at least partly on top of the monocrystalline silicon layer region 13' to obtain an electric connection there between. The polycrystalline silicon layer region 71 constitutes an integral part of the lower electrode of the capacitor.

An outside sidewall spacer 72 of an insulating material is formed to laterally surround and thus electrically isolate the further doped silicon layer region 71. This outside sidewall spacer 72 may be formed simultaneously with, or subsequent to, the formation of the outside spacer 61, which surrounds the polycrystalline silicon layer region 18 that constitutes the upper electrode of the capacitor.

The upper surfaces of the polycrystalline layer regions 18, 71 are silicided in a self-aligned silicidation method whereupon metal silicide layer regions 62, 73 are formed. Simultaneously herewith, a metal silicide layer region 74 is formed on top of the upper surface of the monocrystalline silicon layer region 13' between the polycrystalline layer regions 18, 71.

If the fabrication process is a bipolar or BiCMOS process, the further polycrystalline silicon layer region 71, which is part of the lower electrode of the capacitor, is advantageously formed simultaneously with the formation of emitter layer regions for bipolar transistors and gate layer regions for MOS transistors.

In other respects this embodiment may be identical with the embodiment described with reference to FIGS. 1-6.

Figure 8:
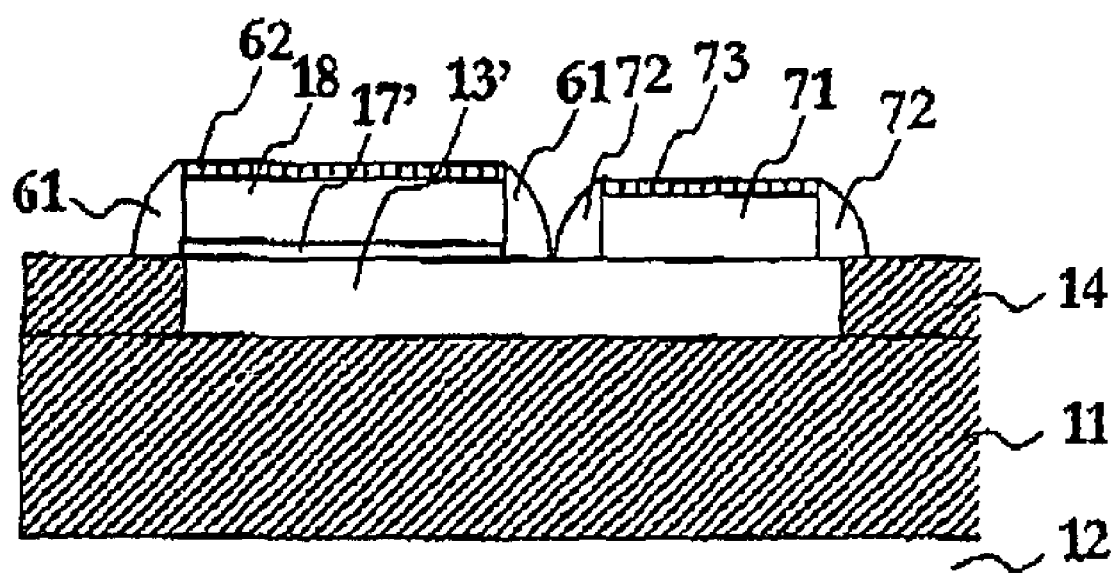

A yet further embodiment of the fabrication method is illustrated in FIG. 8. This embodiment is identical with the embodiment described with reference to FIG. 7 except for that the lateral distance between the polycrystalline silicon layer regions 18, 71 is similar to, or shorter than, a distance corresponding to the sum of the widths of the outside sidewall spacers 61, 72. By this provision the outside sidewall spacers 61, 72 are filling up the region on the upper surface of the monocrystalline silicon layer region 13' between the polycrystalline layer regions 18, 71, and no metal silicide layer region 74 is formed there.

It shall be appreciated that while the present invention is primarily intended for radio frequency silicon devices, it may as well be useful for high-voltage SOI devices and for smaller devices in silicon-based integrated circuits.

What is claimed is:

1. A method for fabrication of a monolithically integrated SOI substrate capacitor, comprising the steps of:
    forming a trench filled with insulating material in a monocrystalline layer of silicon arranged on top of a layer of an insulating material, wherein said trench reaches down to said layer of insulating material, and surrounds a region of said monocrystalline layer of silicon,
    doping said region of said monocrystalline layer of silicon,
    forming a layer region of an insulating material on top of a portion of said region of said monocrystalline layer of silicon,
    forming a layer region of doped silicon on top of said layer region of insulating material, and
    forming an outside sidewall spacer of an insulating material on top of said region of said monocrystalline layer of silicon, said outside sidewall spacer surrounding said layer region of doped silicon to provide an isolation between said layer region of doped silicon and exposed portions of said region of said monocrystalline layer of silicon, wherein
said region of said monocrystalline layer of silicon, said layer region of an insulating material, and said layer region of doped silicon constitute a lower electrode, a dielectric, and an upper electrode of said monolithically integrated SOI substrate capacitor.

2. A method according to claim 1, wherein said layer region of insulating material is a nitride layer region.

3. A method according to claim 1, wherein the upper surface of said layer region of doped silicon, and said exposed portions of said region of said monocrystalline layer of silicon are silicided.

4. A method according to claim 1, wherein a further doped silicon layer region and an outside sidewall spacer of an insulating material are formed on top of said exposed portions of said region of said monocrystalline layer, said outside sidewall spacer surrounding said further doped silicon layer region.

5. A method according to claim 4, wherein the upper surfaces of said layer region of doped silicon and said further doped silicon layer region are silicided.

6. A method according to claim 4, wherein said layer region of doped silicon and said further doped silicon layer region are formed laterally separated by a distance, which is similar to, or shorter than, a distance corresponding to the sum of the widths of said outside sidewall spacers.

7. A method according to claim 4, wherein said monolithically integrated SOI substrate capacitor is fabricated in a bipolar or BiCMOS process, and said further doped silicon layer region and an emitter layer region for a bipolar transistor are formed simultaneously.

8. A method according to claim 1, wherein said monolithically integrated SOI substrate capacitor is fabricated in a bipolar or BiCMOS process, and said layer region of doped silicon and a base layer region for a bipolar transistor are formed simultaneously.

9. A method according to claim 1, wherein said monolithically integrated SOI substrate capacitor is fabricated in a bipolar or BiCMOS process, and said region of said monocrystalline layer of silicon and a collector region for a bipolar transistor are doped simultaneously.

10. A method according to claim 1, wherein said monocrystalline layer of silicon is formed to a thickness of less than about 200 nm.

11. A method according to claim 1, wherein said trench filled with insulating material is an STI (Shallow Trench Isolation) region.

12. A method for fabrication of a monolithically integrated SOI substrate capacitor, comprising the steps of:
    forming a trench filled with insulating material in a monocrystalline layer of silicon arranged on top of a layer of an insulating material, wherein said trench reaches down to said layer of insulating material, and surrounds a region of said monocrystalline layer of silicon,
    doping said region of said monocrystalline layer of silicon,
    forming a layer region of an insulating material on top of a portion of said region of said monocrystalline layer of silicon,
    forming a layer region of doped silicon on top of said layer region of insulating material, and
    forming an outside sidewall spacer of an insulating material on top of said region of said monocrystalline layer of silicon, said outside sidewall spacer surrounding said layer region of doped silicon to provide an isolation between said layer region of doped silicon and exposed portions of said region of said monocrystalline layer of silicon, wherein said region of said monocrystalline layer of silicon, said layer region of an insulating material, and said layer region of doped silicon constitute a lower electrode, a dielectric, and an upper electrode of said monolithically integrated SOI substrate capacitor, and forming a further doped silicon layer region and an outside sidewall spacer of an insulating material on top of said exposed portions of said region of said monocrystalline layer, said outside sidewall spacer surrounding said further doped silicon layer region.

13. A method according to claim 12, wherein said layer region of doped silicon and said further doped silicon layer region are formed laterally separated by a distance, which is similar to, or shorter than, a distance corresponding to the sum of the widths of said outside sidewall spacers.

* * * * *